THREE-PHASE METAL-OXIDE-SEMICONDUCTOR LOGIC CIRCUIT

Filed June 9, 1967 2 Sheets-Sheet 1

INVENTOR
YAO TUNG YEN

BY Louis A. Kline
John J. Callahan
Glenn W. Bowen
HIS ATTORNEYS

THREE-PHASE METAL-OXIDE-SEMICONDUCTOR LOGIC CIRCUIT

Filed June 9, 1967 2 Sheets-Sheet 2

| LOGIC DEFINITION | |
|---|---|
| • | AND |
| + | OR |
| $\overline{(\ )}$ | NOT |

INVENTOR
YAO TUNG YEN
BY Louis A Kline
John J. Callahan
Glenn W. Bones
HIS ATTORNEYS 3,497,715
Patented Feb. 24, 1970

3,497,715

THREE-PHASE METAL-OXIDE-SEMICONDUCTOR LOGIC CIRCUIT

Yao Tung Yen, Kettering, Ohio, assignor to The National Cash Register Company, Dayton, Ohio, a corporation of Maryland Filed June 9, 1967, Ser. No. 644,994
Int. Cl. H03k *19/08*
U.S. Cl. 307—205 4 Claims

ABSTRACT OF THE DISCLOSURE

A three-phase, three-stage logic circuit employing metal-oxide-semiconductor transistors (MOST's) is disclosed. The disclosed three-phase, three-stage logic circuit is compared with a prior-art four-phase, two-stage MOST logic circuit.

BACKGROUND OF THE INVENTION

A typical MOST, which is a P-channel, enhancement mode, metal-oxide-semiconductor field effect transistor, is shown in FIGURE 3. The P region 10 is the source, the P region 12 is the drain, and the substrate 18 is of an N-type semiconductor material. The gate 14 is insulated from the substrate 18 by the thin oxide layer 16. The MOST is discussed in greater detail in the publication "The MOST, a Revolution in Electronic Systems," by H. S. Bobb and Donald E. Farina, General Micro-Electronics, Incorporated, 2920 San Ysidro Way, Santa Clara, Calif., U.S.A., March 1965, second edition. The MOST comprises a conductive channel between the source and the drain regions only when a particular voltage is applied to a gate. In this condition, the source and the drain are conductively connected by a small region of the channel (the inverted region) which has the same conductivity type as the source and the drain. This mode of operation is referred to as the "enhancement mode." FIGURE 1 is an operating characteristic for a typical MOST device, where $I_{DS}$ is the drain-to-source current, $V_{DS}$ is the drain-to-source voltage, and $V_{GS}$ is the gate-to-source voltage.

MOST devices offer many advantages over conventional bi-polar transistor circuits when employed in integrated circuitry. MOST field effect devices have improved reliability, a reduced component cost, and smaller size, and they require less operating power. The circuit of FIGURE 2*a* is an example of a prior-art MOST logic circuit. The timing diagram for the circuit of FIGURE 2*a* is shown in FIGURE 2*b*.

In the dynamic four-phase MOST logic circuit of FIGURE 2*a*, the four clock signals not only provide the timing of the logic circuit but are also used as power supplies for the circuit. The MOST field effect device 20 has its drain 22 and its gate 26 connected to receive clock Phase 1. The source of the MOST 20 is connected to the drain of the MOST 25 at the junction point 24. The gate 28 of the MOST 25 is connected to receive the Phase 2 clock supply voltage. The source of the MOST 25 is connected to the drain of the MOST 32 at the junction point 30. The gate 36 of the MOST 32 is connected to receive the input signal X, and the source 38 is connected to receive the Phase 1 clock signal. The capacitance 64 is not a physical capacitor, but it is rather the equivalent capacitance of the gate-to-substrate capacitance of the MOST 56 plus the other stray capacitances which are associated with the output lead 34, which runs between the junction point 24 and the gate 58 of the MOST 56.

During the Phase 1 clock time, the voltage at the drain 22 and the gate 26 of the MOST 20 is of a negative polarity. The voltage at the gate 28 is also negative during the Phase 1 clock time, as shown in FIGURE 2*b*. However, a negative polarity Phase 1 voltage is also applied to the source 38 of the MOST 32, thereby preventing current flow through the MOST 32 during the Phase 1 clock time. Therefore, since the voltage on the drain 22 and the voltage on the gate 26 are of the same polarity, the MOST 20 will momentarily turn on and will charge the capacitance 64 to a negative voltage which is equal to the negative polarity clock supply voltage plus the gate-to-source voltage drop due to conduction. During the latter half of the Phase 2 clock time, the Phase 1 supply voltage goes to a ground potential level, while the Phase 2 supply voltage remains at a negative voltage level, as shown in FIGURE 2*b*. During this portion of the Phase 2 clock time, conduction through the MOST 32 depends on the logic state of the input signal X. Since the drain of the MOST 25 is at a negative voltage level due to the charge on the capacitance 64, and since the gate 28 is at a negative voltage level during this portion of the Phase 2 clock time, a negative input signal X will cause conduction through the MOST 32 to a source 38, which is now at a ground potential level. A negative voltage at the gate 36 is then considered a logic level "1." If the input signal X at the gate 36 is at ground level, the MOST 32 will not conduct, thus signfying that the input signal X is a logical "0." No discharging or charging paths are presented to the capacitance 64 during the latter portion of the Phase 2 clock time and during the Phase 3 and Phase 4 clock times, and the voltage level across the capacitance 64 cannot change during these times. Therefore, the logic signal $B_1$ on the line 34 may be sampled during the Phase 4 clock time.

The second stage of the MOST logic circuit of FIGURE 2*a* operates in an analogous manner to the first stage. The only differences are that the second stage employs Phase 3 and Phase 4 clock signals in place of the Phase 1 and the Phase 2 clock signals, respectively, of the first stage. If the gate 36 is coupled to an output terminal 55 of a similar preceding logic circuit stage (not shown), an equivalent gate-to-substrate capacitance will also be associated with the gate 36. The logic output $B_2$ is associated with the output terminal 55, and the equivalent gate-to-substrate capacitance of a similar succeeding stage (not shown) will be sampled during the Phase 2 clock time.

The circuit shown in FIGURE 2*a* consists simply of two inverter stages; however, it should be realized that more complex logic functions may be easily implemented. FIGURE 4 shows the manner in which this may be accomplished by a combination of parallel and series MOST devices. The logic implementation of the series-parallel logic network 66 is shown at the output terminal 68. Although the logic network 66 of FIGURE 4 is shown as replacing the MOST 32 of FIGURE 2*a*, it will be realized by those skilled in the art that a similar logic network may also be employed to replace the MOST 56 of FIGURE 2*a*, to achieve even more complex logic implementation.

The dynamic four-phase, two-stage logic circuit of FIGURE 2*a* has many advantages over prior-art D.C. MOST logic circuits. Since no current ever directly flows from the source 38 of the MOST 32 to the drain 22 of the MOST 20, the power dissipation of the circuit is extremely low. The drain-to-source resistances of the MOST's 20 and 40 may be fairly large, and consequently the sizes of these devices may be very small, since the drain-to-source resistance of a MOST device is inversely proportional to the size of the device. The drain-to-source resistance of the MOST 20 does not need to be large, and therefore the RC time constant for turn-off time will be much lower than it will be for a D.C. MOST logic circuit. Moreover, a minimum value of the ratio of the drain-to-source static resistance of the MOST 20 to the sum of the drain-to-source static resistances of the MOST's 25 and 32 does not need to be maintained for proper operation, as it does in a D.C. MOST logic circuit.

However, the described circuit of FIGURE 2*a* does have several decided advantages. In the prior-art four-phase, two-stage logic circuit, much of the available logic time is used merely to charge the equivalent gate-to-substrate capacitances, such as the capacitance 64, and during this time no logic implementation occurs. For example, in the circuit of FIGURE 2*a*, no logic implementation can occur during the Phase 1 or Phase 3 clock times. In addition, the distribution of four clock lines for a MOST complex array can become very complicated, due to the large number of cross-overs and interconnections which must be made.

In the logic circuit of the present invention, the charging of one equivalent gate-to-substrate capacitance occurs during the discharging of another equivalent gate-to-substrate capacitance, and therefore logic implementation may occur during each of the clock phases. Therefore, the three-phase, three-stage MOST logic circuit of the present invention is substantially faster than the four-phase, two-stage MOST logic circuit of FIGURE 2*a*. In addition, the necessity of distributing only three clock lines instead of four is a decided advantage of the circuit of the present invention.

SUMMARY

A three-phase, three-stage insulated gate field-effect transistor logic circuit. In the preferred embodiment, the field-effect transistors are metal-oxide-semiconductor transistors.

DESCRIPTION OF THE PREFERRED EMBODIMENT

Figures 1, 2A, 2B, 3:
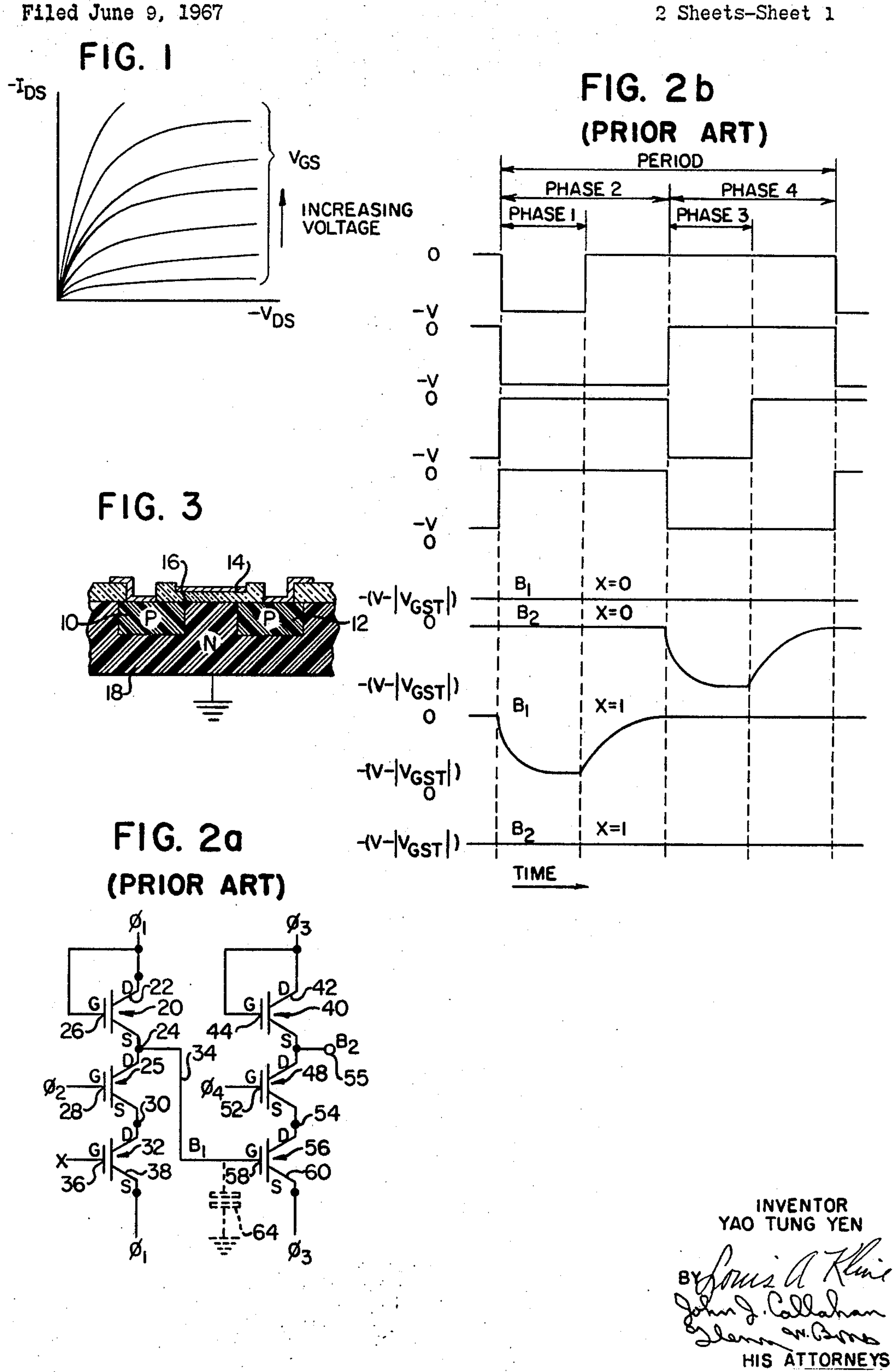
FIGURE 1 is a characteristic operating curve of a typical MOST device.
FIGURE 2*a* is a schematic diagram of a prior-art dynamic four-phase, two-stage MOST logic circuit.
FIGURE 2*b* is the timing chart for the circuit of FIGURE 2*a*.
FIGURE 3 is a cross-sectional view of a typical MOST field effect device.
Figures 4A, 4B, 5A, 5B:
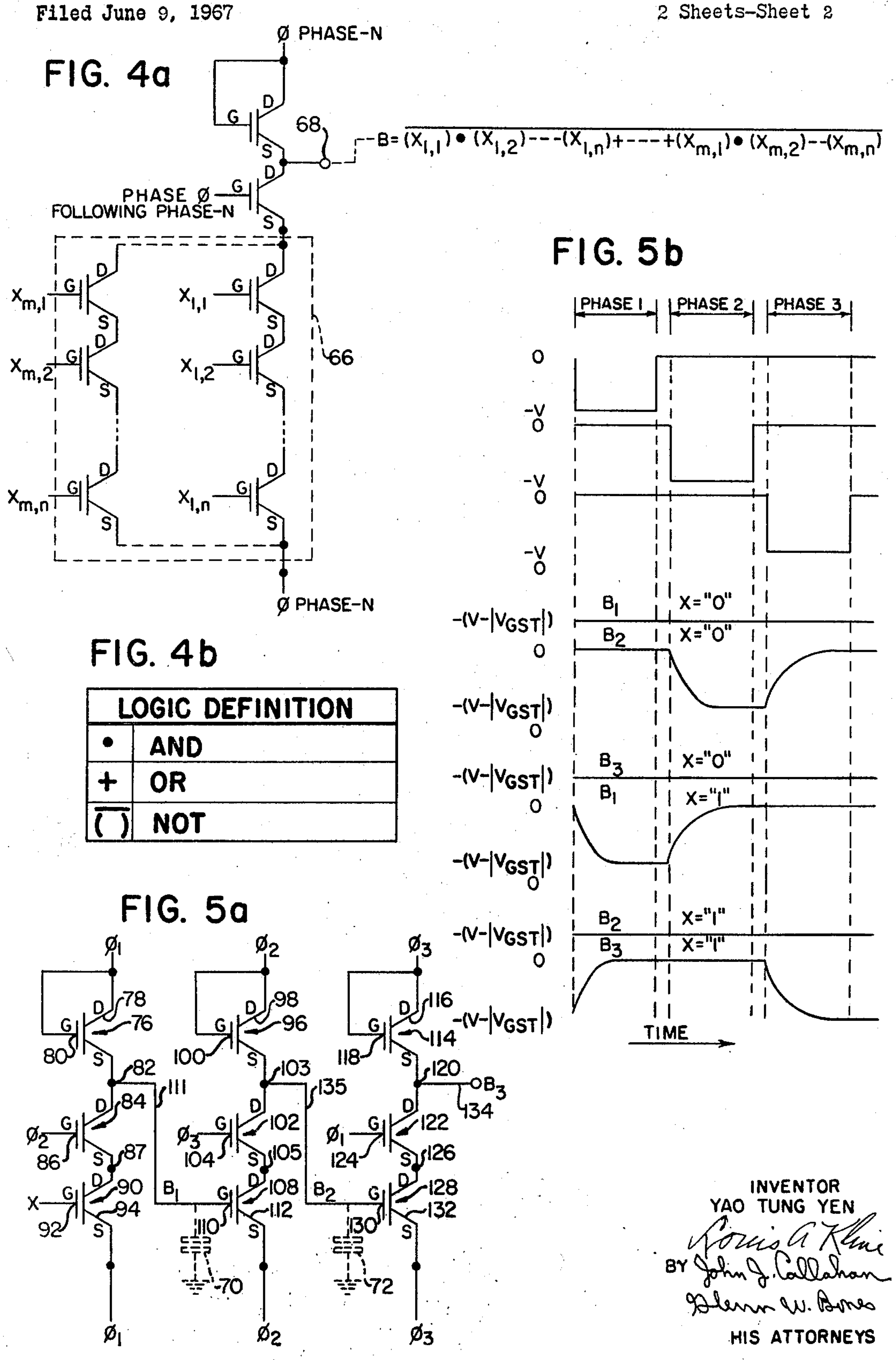
FIGURE 4*a* is a schematic diagram of a complex logic network employing MOST devices.
FIGURE 4*b* is a logic definition chart for the output equation of the logic network of FIGURE 4*a*.
FIGURE 5*a* is a schematic diagram of the dynamic three-phase, three-stage MOST logic circuit of the present invention.
FIGURE 5*b* is the timing diagram for the circuit of FIGURE 5*a*.

In the circuit of FIGURE 5*a*, the capacitance 70 is the equipvalent capacitance of the gate-to-substrate capacitance of the MOST 108 plus other stray capacitances associated with the line 111. The capacitance 72 is the equivalent capacitance of the gate-to-substrate capacitance of the MOST 128 plus the stray capacitances associated with the output line 135. During the Phase 1 clock time, the drain 78 and the gate 80 of the MOST 76 are both at a negative voltage level. The gate 86 of the MOST 84 is at a ground potential level, and therefore conduction cannot occur through the MOST's 84 and 90. Therefore, during the Phase 1 clock time, the capacitance 70 will be charged to a negative voltage level which is equal to the negative voltage of the Phase 1 clock supply voltage plus the gate-to-source voltage drop of the MOST 76 due to conduction. The capacitance 70 therefore acquires a negative voltage charge during the Phase 1 clock time.

During the Phase 2 clock time, the MOST 76 is turned off, since the Phase 1 supply voltage goes to a ground level at this time. Since the gate 86 is at a negative voltage level during the Phase 2 clock time, the logic input signal X supplied to the gate 92 of the MOST 90 determines whether or not conduction will occur through the MOST 90. A "1" logic level signal at the gate 92 is represented by a negative voltage level. If a negative voltage level is applied to the gate 92, conduction will occur through the MOST's 84 and 90, since the drain of the MOST 84 is connected to the source of the MOST 76 at the junction point 82, which is held at a negative potential by the capacitance 70. A discharging current will then flow through the capacitance 70 and the drain of the MOST 84 to the source 94 of the MOST 90, which is now at a ground voltage level. If the logic level input signal X is at a "0" level, the gate 92 will be at a ground potential level, and conduction will not occur through the MOST's 84 and 90; therefore, the capacitance 70 will not be discharged. The substrates of all of the MOST devices of FIGURE 5*a* are preferably connected to a common ground.

During the Phase 2 clock time, when the logic level signal X was determining whether or not the capacitance 70 would discharge, the MOST 96 was also conducting, since the drain 98 and the gate 100 of this device were both supplied with a negative voltage. The MOST 102 is not conducting during the Phase 2 clock time, since the gate 104 is connected to the ground level phase 3 clock signal at this time. Thus, during the time that the capacitance 70 may, or may not, be discharging, the capacitance 72 will be acquiring a charge. The charged state of the capacitance 70 determines whether or not the capacitance 72 will be discharged during the Phase 3 clock time, since the state of the capacitance 70 determines the conduction state of the MOST 108 during this time and is indicative of the logic level signal that is received on the input line 111.

In a similar manner, while the capacitance 72 may, or may not, be discharging, the MOST 114 is charging the equivalent gate-to-substrate capacitance of a succeeding stage (not shown) that is connected to the output terminal 134, during the Phase 3 clock time, since the drain 116 and the gate 118 of the MOST 114 are both supplied with negative voltages during this time. If the gate 92 is coupled to an output terminal 134 of a similar preceding logic circuit (not shown), an equivalent gate-to-substrate capacitance will be associated with the gate 92.

The logic level signal $B_1$, which represents the charge across the capacitance 70, cannot change during the Phase 3 clock time, and therefore the $B_1$ signal may be sampled during this time. Likewise, the logic signal $B_2$, which is represented by the charge across the capacitance 72, and the logic level signal $B_3$, which is represented by the charge across the equivalent gate-to-substrate capacitance associated with the gate 92, may be sampled during the Phase 1 and the Phase 2 clock times, respectively.

While the logic circuit of FIGURE 5*a* employs inverters, it is apparent that a more complex logic circuit configuration, such as the logic network 66 of FIGURE 4*a*, may be employed to replace any or all of the MOST devices 90, 108, and 128. Thus it is seen that the logic circuits of the present invention will implement very complex logic functions, that they are considerably faster than four-phase, two-stage MOST logic circuits, since logic implementation may occur during all three clock times, and that, in addition, they reduce the problems associated with the distribution of the clock lines in a MOST logic system.

I claim:

1. A three-stage logic circuit employing insulated gate field-effect transistors and three clock phase voltages, comprising:

(a) a first stage, comprising:

(1) a first insulated gate field-effect transistor having interconnected drain and gate electrodes which are coupled to a first clock phase voltage source, and (2) a second insulated gate field-effect transistor having its drain electrode connected to the source electrode of the first insulated gate field-effect transistor and its gate electrode coupled to a second clock phase voltage source, and (3) a first logic network having a configuration which is logically reducible to a third insulated gate field-effect transistor having its drain electrode connected to the source electrode of the second insulated gate field-effect transistor, its source electrode connected to the first clock phase voltage source, and its gate electrode coupled to a first input logic signal source which effects storage of a logical "1" or a logical "0" signal in the equivalent gate-to-substrate capacitance of the third insulate gate field-effect transistor during the first clock phase time according to whether or not the equivalent gate-to-substrate capacitance of the third insulated gate field-effect transistor is discharged through the first input signal source during this time, the equivalent gate-to-substrate capacitance of the third insulated gate field-effect transistor being charged through the first input signal source during the third clock phase time, and (b) a second stage, comprising:

(1) a fourth insulated gate field-effect transistor having interconnected drain and gate electrodes which are coupled to the second clock phase voltage source, and (2) a fifth insulated gate field-effect transistor having its drain electrode connected to the source electrode of the fourth insulated gate field-effect transistor and its gate electrode coupled to a third clock phase voltage source, and (3) a second logic network having a configuration which is logically reducible to a sixth insulated gate field-effect transistor having its drain electrode connected to the source electrode of the fifth insulated gate field-effect transistor, its source electrode coupled to the second clock phase voltage source, and its gate electrode coupled to a second input logic signal source which effects storage of a logical "1" or a logical "0" signal in the equivalent gate-to-substrate capacitance of the sixth insulated gate field-effect transistor during the second clock phase time according to whether or not the equivalent gate-to-substrate capacitance of the sixth insulated gate field-effect transistor is discharged through the second input signal source during this time, the equivalent gate-to-substrate capacitance of the sixth insulated gate field-effect transistor being charged through the second input signal source during the first clock phase time, (c) a third stage, comprising:

(1) a seventh insulated gate field-effect transistor having interconnected drain and gate electrodes which are coupled to the third clock phase voltage source, and (2) an eighth insulated gate field-effect transistor having its drain electrode connected to the source electrode of the seventh insulated gate field-effect transistor and its gate electrode coupled to the first clock phase voltage source, and (3) a third logic network having a configuration which is logically reducible to a ninth insulated gate field-effect transistor having its drain electrode connected to the source electrode of the eighth insulated gate field-effect transistor, its source electrode coupled to the third clock phase voltage source, and its gate electrode coupled to a third input logic signal source which effects storage of a logical "1" or a logical "0" signal in the equivalent gate-to-substrate capacitance of the ninth insulated gate field-effect transistor during the third clock phase time according to whether or not the equivalent gate-to-substrate capacitance of the ninth insulated gate field-effect transistor is discharged through the third input signal source during this time, the equivalent gate-to-substrate capacitance of the ninth insulated gate field-effect transistor being charged through the third signal source during the second clock phase time.

2. A device as in claim 1 wherein the substrates of the insulated gate field-effect transistors are at a common ground voltage level.

3. A logic circuit as in claim 2 wherein the insulated gate field-effect transistors are metal-oxide-semiconductor field-effect transistors.

4. A logic circuit as in claim 1 wherein the insulated gate field-effect transistors are metal-oxide-semiconductor field-effect transistors.

References Cited

UNITED STATES PATENTS

| | | | |
|---|---|---|---|
| 3,421,092 | 1/1969 | Bower et al. ______ | 307—221 X |
| 3,454,785 | 7/1969 | Norman et al. ____ | 307—251 X |

DONALD D. FORRER, Primary Examiner

U.S. Cl. X.R.

307—208, 221, 304